United States Patent [19]

Morinaga

[11] Patent Number: 4,926,151
[45] Date of Patent: May 15, 1990

[54] CHIP-TYPE COIL ELEMENT

[75] Inventor: Tetsuya Morinaga, Kyoto, Japan

[73] Assignee: Murata Manufacturing Co., Ltd., Japan

[21] Appl. No.: 287,726

[22] Filed: Dec. 21, 1988

[30] Foreign Application Priority Data

Dec. 21, 1987 [JP] Japan .............................. 62-194181[U]

[51] Int. Cl.⁵ .............................................. H01F 3/00
[52] U.S. Cl. .................................... 335/296; 335/297; 336/83; 336/196
[58] Field of Search ....................... 335/281, 296, 297; 336/83, 192, 195, 196, 221

[56] References Cited

U.S. PATENT DOCUMENTS

| | | | |
|---|---|---|---|
| 1,517,770 | 11/1924 | Ziegler | 336/192 |
| 3,824,518 | 7/1974 | Slenker | 336/192 X |
| 4,245,207 | 1/1981 | Murakami et al. | 336/192 X |
| 4,314,221 | 2/1982 | Satou et al. | 336/83 |
| 4,696,100 | 9/1987 | Yamamoto et al. | 336/83 |
| 4,769,900 | 9/1988 | Morinaga et al. | 336/83 |
| 4,801,912 | 1/1989 | McElheny et al. | 336/83 X |

FOREIGN PATENT DOCUMENTS 1814282 8/1969 Fed. Rep. of Germany ........ 336/83

Primary Examiner—George Harris
Attorney, Agent, or Firm—Ostrolenk, Faber, Gerb & Soffen

[57] ABSTRACT

A coil (33, 33a) is wound on a bobbin (22, 22a), one flange (24, 24a) of which has an end surface provided with a central projection (26, 26a) on its center and first and second end projections (27, 27a; 28, 28a) on its opposite end portions respectively, thereby to define first and second cavities (29, 29a; 30, 30a). First and second electrodes (31, 31a; 32, 32a) are provided to extend from the first and second end portions of the flange toward its side surface. First and second terminals (34, 34a; 35, 35a) of the coil are respectively received in the first and second cavities, which in turn are filled with solder members (36, 36a; 37, 37a) to electrically connect the first and second terminals to the first and second electrodes respectively. The first and second end projections are adapted to reduce the volume of solder required for mounting the chip-type coil element as well as to substantially prevent the coil element from inclination, thereby to prevent a tombstoning phenomenon.

5 Claims, 3 Drawing Sheets

CHIP-TYPE COIL ELEMENT

BACKGROUND OF THE INVENTION

1. Field of the Invention

The present invention relates to a chip-type coil element, and more particularly, it relates to structure of a chip-type coil element which comprises a bobbin and a coil wound on the same.

2. Description of the Background Art

FIG. 4 is a sectional view showing a conventional chip-type coil element 1, which is of interest to the present invention. The coil element 1 comprises a bobbin 5 of a magnetic material such as ferrite, for example, having a core 2 and first and second flanges 3 and 4 which are provided on end portions of the core 2 respectively. The flanges 3 and 4 are in the form of quadrangular plates, for example. The first flange 3, which is shown in the lower part of FIG. 4, is larger in size than the second flange 4, which is shown in the upper part.

A coil 6 is wound on the core 2 of the bobbin 5. First and second electrodes 7 and 8 are provided on the lower flange 3, to be separated from each other. These electrodes 7 and 8 are adapted to extend from an end surface toward the side surface of the flange 3. First and second terminals 9 and 10 of the coil 6 are soldered to the first and second electrodes 7 and 8 respectively.

The coil element 1 is mounted on a circuit board 11, as shown in FIG. 6. Before operation for such mounting, solder paste members 14 and 15 are applied on circuit patterns 12 and 13, which are formed on the circuit board 11, in prescribed thickness by a method such as screen printing, as shown in FIG. 5. Then, the coil element 1 is placed on the solder paste members 14 and 15 while downwardly directing the lower surface of the lower flange 3. Thus, the coil element 1 is temporarily fixed to the circuit board 11 through the solder paste members 14 and 15. Then, the solder paste members 14 and 15 are reflowed to adhere to the lower and side surfaces of the flange 3 as shown in FIG. 6, thereby to completely mount the coil element 1 on the circuit board 11.

It has been recently required to reduce the volume of solder forming the solder paste members 14 and 15 in the operation for mounting the coil element 1. Thus, the solder paste members 14 and 15 may be reduced in thickness as shown in FIG. 7. When the solder paste members 14 and 15 are thus reduced in thickness, however, the volume of solder employable for connecting the electrodes 7 and 8 with the circuit patterns 12 and 13 is so decreased that the solder paste members 14 and 15 cannot cover the side surface of the flange 3. Thus, reliability in soldering is reduced.

When the volume of solder forming the solder paste members 14 and 15 is reduced, the coil element 1 tends to be inclined as shown in FIG. 9, in the so-called tombstoning phenomenon. Such a tombstoning phenomenon is caused by a lag in melting time between the solder paste members 14 and 15 in reflow soldering. When the left solder paste members 14 is molten in advance of the right solder paste member 15 as shown in FIG. 9, for example, torque is caused by surface tension of the molten solder member 14 to fulcrum the first terminal 9 for leftwardly inclining the coil element 1. Consequently, the coil element 1 is inclined as shown in FIG. 9, and hence the same cannot be mounted on the circuit board 11 in a desired mode. When the solder paste members 14 and 15 are increased in thickness as shown in FIGS. 5 and 6, such a tombstoning phenomenon is hardly caused since the coil element 1 is temporarily fixed through the solder paste members 14 and 15 with relatively strong force.

SUMMARY OF THE INVENTION

Accordingly, an object of the present invention is to provide structure of a chip-type coil element, which can achieve reflow soldering to circuit patterns through solder paste with no problem even if solder paste members are reduced in thickness.

A chip-type coil element according to the present invention comprises a bobbin which has a core and first and second flanges provided on end portions of the core respectively. The first flange has an end surface which extends perpendicularly to the longitudinal direction of the core and a side surface which extends in parallel to the said longitudinal direction. The end surface of the first flange is provided with a central projection on its center and first and second end projections on its opposite end portions respectively, whereby first and second cavities are defined between the central projection and the first and second end projections respectively. A coil is wound on the core. This coil has first and second terminals. First and second electrodes are provided on the first flange to extend from the first and second end projections toward the side surface. The first and second terminals of the coil are received in the first and second cavities respectively, to be electrically connected to the first and second electrodes.

According to the present invention, the terminals of the coil can be located in the cavities, whereby portions of the first and second electrodes provided on the first and second end projections can be roughly adjusted to match circuit patterns. Thus, even if solder paste members applied on the circuit patterns are reduced in thickness, it is possible to sufficiently cover portions of the first and second electrodes provided on the side surface of the flange with solder by reflow soldering. Thus, the coil element can be reliably soldered to the circuit patterns even if the volume of solder paste employed for reflow soldering is small. Thus, the volume of solder paste employed for reflow soldering can be reduced, thereby to reduce the weight of the coil element mounted on a circuit board as well as the material cost based on the solder as employed.

According to the present invention, further, torque for inclining the chip-type coil element fulcrums an end projection, which is at the exterior of a terminal of the coil. Thus, the coil element is not readily inclined, to cause substantially no tombstoning phenomenon.

According to a preferred embodiment of the present invention, the first and second electrodes are adapted to extend toward wall surface portions defining the first and second cavities respectively. The first and second cavities are filled with solder while receiving the first and second terminals of the coil respectively. Thus, an end surface of the first flange provides a substantially flat plane.

According to another embodiment of the present invention, the first and second end projections are defined to have rounded faces. Thus, the first and second electrodes respectively provided on the first and second end projections are prevented from parting.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
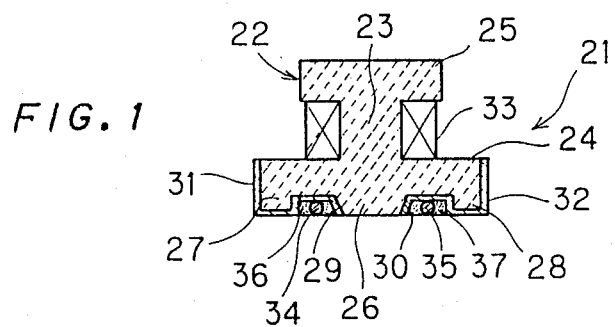
FIG. 1 is a sectional view showing a chip-type coil element according to an embodiment of the present invention.

FIG. 1 is a sectional view showing a chip-type coil element 21 according to an embodiment of the present invention.

Referring to FIG. 1, the chip-type coil element 21 comprises a bobbin 22 of a magnetic material such as ferrite, for example. The bobbin 22 has a core 23 and first and second flanges 24 and 25 which are provided on end portions of the core 23 respectively. Both of these flanges are in the form of quadrangular plates. The first flange 24 is larger in size than the second flange 25.

The first flange 24 has an end surface which extends perpendicularly to the longitudinal direction of the core 23 and a side surface which extends in parallel to the said longitudinal direction respectively. The end surface of the first flange 24 is provided with a central projection 26 on its center and first and second end projections 27 and 28 on its opposite end portions. Thus, first and second cavities 29 and 30 are defined between the central projection 26 and the first and second end projections 27 and 28 respectively.

First and second electrodes 31 and 32 are provided to extend from the first and second end projections 27 and 28 toward side portions of the flange 24. According to this embodiment, the first and second electrodes 31 and 32 are adapted to extend toward wall surface portions defining the first and second cavities 29 and 30 respectively.

A coil 33 is wound on the core 23 of the bobbin 22. First and second terminals 34 and 35 of the coil 33 are received in the first and second cavities 29 and 30 respectively. In this state, the first and second cavities 29 and 30 are filled with solder members 36 and 37, thereby to electrically connect the first and second terminals 34 and 35 to the first and second electrodes 31 and 32 respectively. The first and second cavities 29 and 30 can be filled with a small volume of the solder members 36 and 37, whereby the end surface of the flange 24 provides a substantially flat plane.

Figure 2:
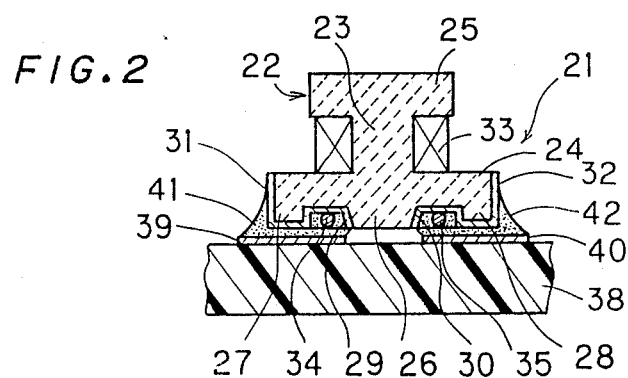
FIG. 2 is a sectional view showing the chip-type coil element of FIG. 1 mounted on a circuit board.
Figure 7:
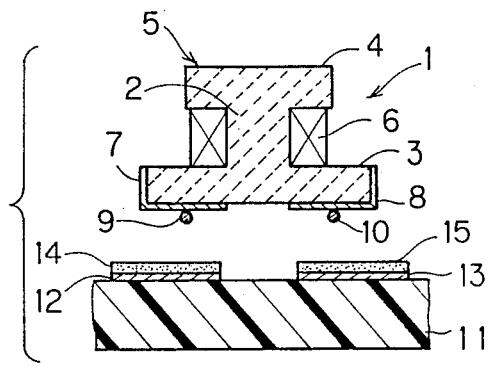
FIG. 7 is a sectional view corresponding to FIG. 5, showing solder paste members which are reduced in thickness as compared with those in FIG. 5.
Figure 8:
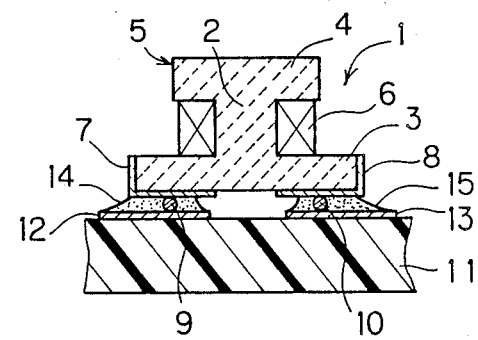
FIG. 8 is a sectional view corresponding to FIG. 6, to illustrate the prior art state of inferior soldering.
Figure 9:
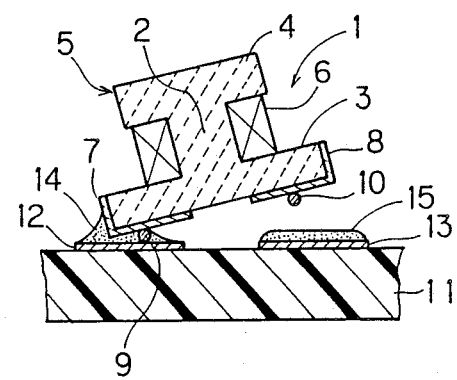
FIG. 9 is a sectional view illustrating a tombstoning phenomenon caused on a chip-type coil element.

The aforementioned chip-type coil element 21 is mounted on a circuit 38, as shown in FIG. 2. Similarly to the prior art example shown in FIG. 7, solder paste members 41 and 42 are applied in relatively small volume on circuit patterns 39 and 40, which are formed on the circuit board 38, by a method such as screen printing. Then, the coil element 21 is positioned on the circuit board 38 so that the first and second electrodes 31 and 32 are in contact with the solder paste members 41 and 42 respectively. Thereafter the solder members 41 and 42 are reflowed to cover not only the end surface but the side surface of the flange 24, thereby to effectively solder the first and second electrodes 31 and 32 to the circuit patterns 39 and 40. Particularly, since the flange 24 is substantially flat over its end surface, i.e., the lower surface, the solder members 41 and 42 sufficiently cover portions along the side surface of the flange 24 with small volume.

Even if the solder paste member 41 or 42 is molten in advance of the other member 42 or 41 to cause torque for inclining the coil element 21, the coil element 21 is given scarcely any inclination since such torque fulcrums either end projection 27 or 28. Thus, the so-called tombstoning phenomenon hardly takes place.

Figure 3:
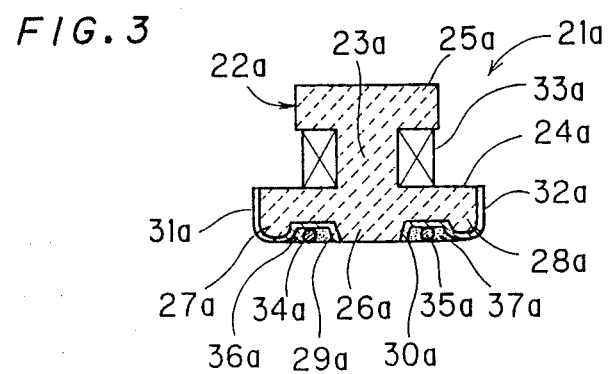
FIG. 3 is a sectional view showing a chip-type coil element according to another embodiment of the present invention.

FIG. 3 shows another embodiment of the present invention. Referring to FIG. 3, parts corresponding to those of FIG. 1 are indicated by the same reference numerals with subscripts "a", to omit redundant description.

The feature of a chip-type coil element 21a shown in FIG. 3 resides in that first and second end projections 27a and 28a have rounded faces. The advantage of this feature is as follows: In the coil element 21 shown in FIG. 1, the end projections 27 and 28 are so angular in configuration that the electrodes 31 and 32 are easily parted in angular edge portions thereof. On the other hand, the end projections 27a and 28a of the coil element 21a shown in FIG. 3 have rounded faces, thereby to substantially prevent parting of electrodes 31a and 32a.

Figure 4:
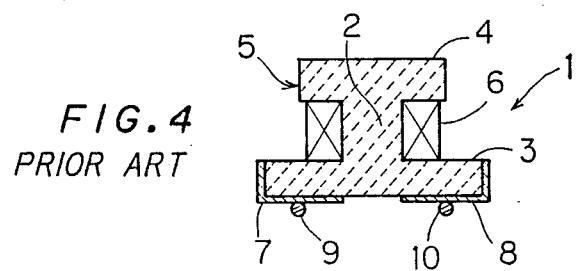
FIG. 4 is a sectional view showing a conventional prior art chip-type coil element forming the background of the present invention.
Figure 5:
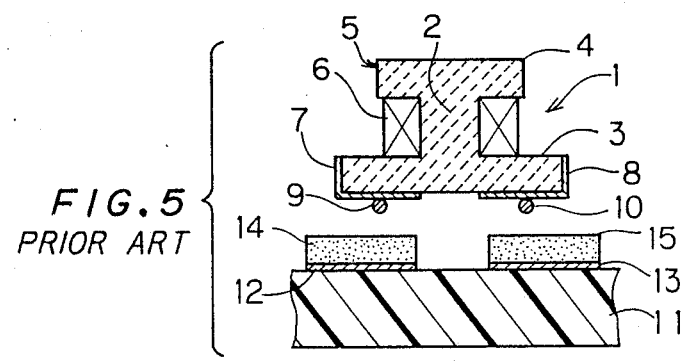
FIG. 5 is a sectional view showing the chip-type coil element of FIG. 4 before being mounted on a circuit board.
Figure 6:
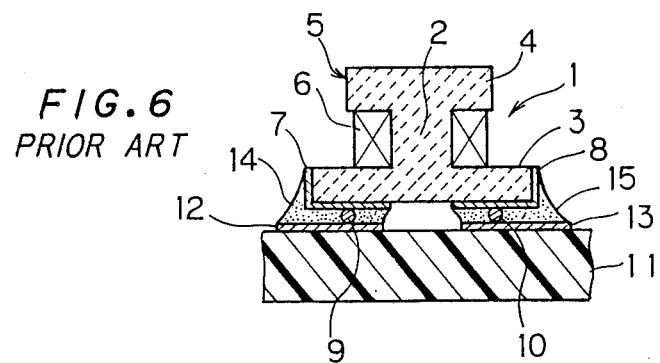
FIG. 6 is a sectional view showing the chip-type coil element of FIG. 4 mounted on a circuit board.

With respect to the rate of occurrence of a tombstoning phenomenon, the conventional coil element 1 shown in FIG. 4 was compared with the inventive coil element, particularly the coil element 21a shown in FIG. 3. In either case, 5000 samples were heated with vapor of an inert liquid for 30 seconds absolutely with no preheating, to perform reflow soldering. A tombstoning phenomenon was caused in six samples of the conventional coil element 1 with the rate of occurrence of 0.12%, while no tombstoning phenomenon was caused in the coil element 21a according to the present invention.

Although the samples were heated through evaporation of an inert liquid in the so-called vapor phase soldering for performing reflow soldering in the above experiment, such reflow soldering can be carried out through a different heating method. Further, the inventive chip-type coil element can be mounted on a circuit board not only through reflow soldering, but through flow soldering. When flow soldering is employed, an adhesive for temporarily fixing the coil element to the circuit board is preferably applied between the central projection 26 or 26a and the circuit board.

Although the present invention has been described and illustrated in detail, it is clearly understood that the same is by way of illustration and example only and is not to be taken by way of limitation, the scope of the present invention being limited only by the terms of the appended claims.

What is claimed is:

1. A chip-type coil element comprising:
   a bobbin having a core and first and second flanges provided on end portions of said core respectively, said first flange having an end surface extending perpendicularly to the longitudinal direction of said core and a side surface extending parallel to said longitudinal direction, said end surface of said first flange being provided with a central projection on its center and first and second end projections on its opposite end portions respectively, thereby to define first and second cavities between said central projection and said first and second end projections respectively;
   a coil being wound on said core and having first and second terminals; and
   first and second electrodes provided to extend from said first and second end projections toward said side surface;
   said first and second terminals being received in said first and second cavities to be electrically connected to said first and second electrodes respectively.

2. A chip-type coil element in accordance with claim 1, wherein wall surfaces are provided defining said first and second cavities respectively, said electrodes extending toward said wall surfaces.

3. A chip-type coil element in accordance with claim 2, wherein said first and second cavities are filled with solder members while receiving said first and second terminals.

4. A chip-type coil element in accordance with claim 3, wherein said end surface of said first flange provides a substantially flat plane.

5. A chip-type coil element in accordance with claim 1, wherein said first and second end projections have rounded faces.

* * * * *